c12) United States Patent
Izuha et al.

(10) Patent No.: US 7,541,136 B2
(45) Date of Patent: Jun. 2, 2009

(54) MASK, MANUFACTURING METHOD FOR MASK, AND MANUFACTURING METHOD FOR SEMICONDUCTOR DEVICE

(75) Inventors: Kyoko Izuha, Yokohama (JP); Hideki Kanai, Yokohama (JP); Soichi Inoue, Yokohama (JP); Shingo Kanamitsu, Kawasaki (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 530 days.

(21) Appl. No.: 11/472,452

(22) Filed: Jun. 22, 2006

(65) Prior Publication Data

US 2006/0240341 A1 Oct. 26, 2006

Related U.S. Application Data

(62) Division of application No. 10/668,245, filed on Sep. 24, 2003, now Pat. No. 7,094,504.

(30) Foreign Application Priority Data

Sep. 25, 2002 (JP) .............................. 2002-279742

(51) Int. Cl.
*G03C 5/00* (2006.01)
(52) U.S. Cl. ..................................... 430/311
(58) Field of Classification Search ............... 430/5, 430/311, 312, 313, 323, 324; 355/53
See application file for complete search history.

(56) References Cited

U.S. PATENT DOCUMENTS 6,376,139 B1 4/2002 Fujisawa et al.

| 6,440,616 | B1 | 8/2002 | Izuha et al. |
| 6,576,374 | B1 | 6/2003 | Kim |

(Continued)

FOREIGN PATENT DOCUMENTS

JP 04-000449 1/1992

(Continued)

OTHER PUBLICATIONS

Notification of Reasons for Rejection issued by Japanese Patent Office in Japanese application No. 2002-279742 and English translation thereof.

(Continued)

*Primary Examiner*—Stephen Rosasco
(74) *Attorney, Agent, or Firm*—Finnegan, Henderson, Farabow, Garrett & Dunner, L.L.P.

(57) ABSTRACT

Disclosed is a mask comprising a first area including a first surrounding area in which a halftone phase shift film or a stacked film of a halftone phase shift film and an opaque film is provided on a transparent substrate, and a first opening area surrounded by the first surrounding area, and a second area including a second surrounding area in which a halftone phase shift film is provided on the transparent substrate and a second opening area surrounded by the second surrounding area, wherein a transparent film is provided in at least a part of the second opening area, the transparent film being configured to give a predetermined phase difference to exposure light passing through that part of the second opening area in which the transparent film is provided relative to exposure light passing through the second surrounding area.

15 Claims, 11 Drawing Sheets

U.S. PATENT DOCUMENTS

2004/0234869 A1    11/2004    Tejnil

FOREIGN PATENT DOCUMENTS

| JP | 05-142757 | 6/1993 |
| JP | 05-307258 | 11/1993 |
| JP | 07-072611 | 3/1995 |
| JP | 2001-100392 | 4/2001 |
| JP | 2002-258456 | 9/2002 |

OTHER PUBLICATIONS

Suwa et al., "Automatic Laser Scanning Focus Detection Method Using Printed Focus Pattern," SPIE, vol. 2440, pp. 712-720 (1995).

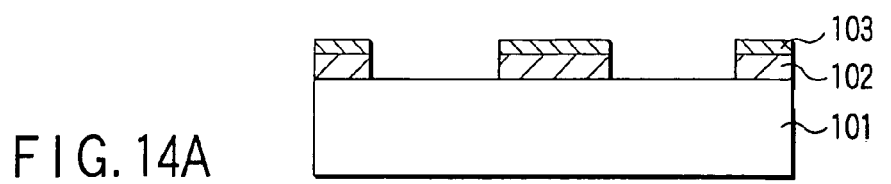
F I G. 14A
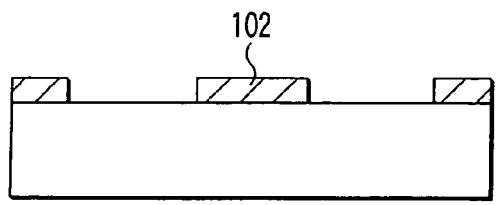
F I G. 14B
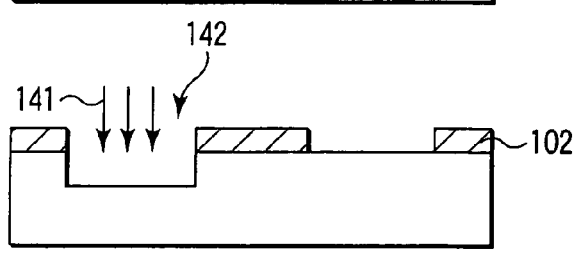
F I G. 14C
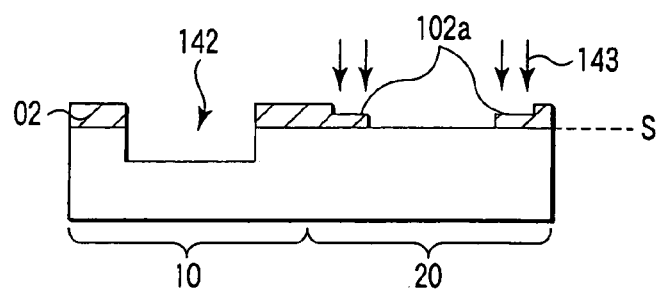
F I G. 14D
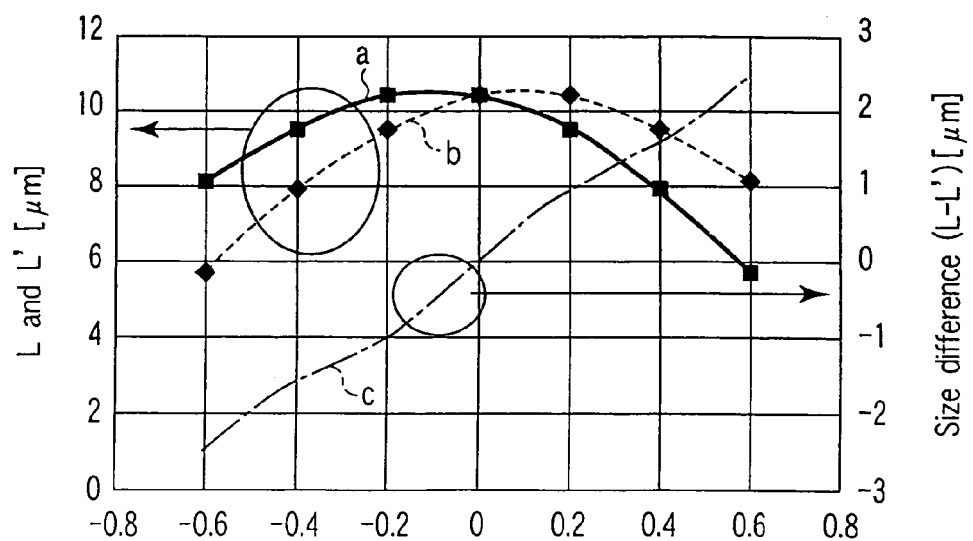
F I G. 15 under the page numbering US 7,541,136 B2.

MASK, MANUFACTURING METHOD FOR MASK, AND MANUFACTURING METHOD FOR SEMICONDUCTOR DEVICE

CROSS-REFERENCE TO RELATED APPLICATIONS

This application is a divisional of application Ser. No. 10/668,245, filed Sep. 24, 2003 now U.S. Pat. No. 7,094,504, which is based upon and claims the benefit of priority from the prior Japanese Patent Application No. 2002-279742, filed on Sep. 25, 2002, the entire contents of both of which are incorporated herein by reference.

BACKGROUND OF THE INVENTION

1. Field of the Invention

The present invention relates to a mask, a manufacturing method for a mask, and a manufacturing method for a semiconductor device.

2. Description of the Related Art

The inventors have already proposed a focus monitor mask used to measure the magnitude of defocus in an exposure apparatus including the sign of the defocus (refer to Jpn. Pat. Appln. Nos. 11-274701 and 11-375472, which correspond to U.S. Pat. No. 6,440,616). FIG. 20 illustrates an example of this focus monitor mask. This figure schematically shows a planar configuration of a mask pattern formed area.

The mask pattern formed area includes a reference mark area 10 and a phase shift mark area 20. The reference mark area 10 has a surrounding portion (surrounding area) 11 including an opaque portion or a halftone portion and five opening portions (opening areas) 12 surrounded by the surrounding portion 11. The phase shift mark area 20 has a surrounding portion 21 including a halftone portion and five opening portions 22 surrounded by the surrounding portion 21. The opening portions 12 and 22 are used as focus monitor marks and have the same diamond-like (rhomboid-like) planar shape. A phase difference between the opening portions 22 and the surrounding portion 21 is set to be 90°. Accordingly, there is a phase difference of 90° between exposure light passing through the opening portions 22 and exposure light passing through the surrounding portion 21.

The use of a mask configured as described above enables focus monitoring. This focus monitoring utilizes misalignment that may occur between the best focus point for the pattern (reference mark) of the opening portions 12 and the best focus point for the pattern (phase shift mark) of the opening portions 22. A monotonous decrease or increase relative to defocus is observed in a size difference between a long side of the reference mark and a long side of the phase shift mark which difference may occur after exposure or development. Thus, by determining the relationship between defocus and this size difference in the form of a calibration curve and subsequently measuring a size difference on a wafer after exposure and development, the magnitude of defocus can be monitored including its direction.

FIG. 22 shows the relationship (calibration curve) between a size difference (L-L') and defocus where L denotes the size of a long side of a reference mark on a wafer and L' denotes the size of a long side of a phase shift mark on the wafer. A line a indicates the size L of the reference mark. A line b indicates the size L' of the phase shift mark. A line c indicates the size difference (L-L'). The size difference c increases monotonously relative to defocus. Accordingly, this calibration curve can be used to determine the magnitude of defocus including its sign. In this connection, varying the magnitude of exposure by ±10% does not substantially change the calibration curve. Therefore, even with a slight variation in the magnitude of exposure, the defocus can be accurately detected.

Now, description will be given of a manufacturing method for a conventional mask having a pattern such as the one shown in FIG. 20. FIGS. 21A to 21H schematically show cross sections taken along line A-A' in FIG. 20.

First, as shown in FIG. 21A, a quartz substrate is provided as a transparent substrate 101. An MoSiOx film is formed on the transparent substrate 101 as a halftone phase shift film 102. Subsequently, a Cr film is formed on the halftone phase shift film 102 as an opaque film 103. Furthermore, a chemically amplified positive type resist 104 is applied to the opaque film 103. The halftone phase shift film 102 sets a phase difference of 180° between exposure light passing through the halftone phase shift film 102 and exposure light passing through the opening portion 12.

Then, as shown in FIG. 21B, focus monitor marks are written in the resist film 104 in a reference mark area and a phase shift mark area. At this time, device pattern is also written in a device pattern forming area (not shown). Subsequently, the substrate is baked and then development is carried out to form a resist pattern 104.

Then, as shown in FIG. 21C, the opaque film 103 and the halftone phase shift film 102 are sequentially etched using the resist pattern 104 as a mask. This etching forms a focus monitor mark pattern corresponding to the planar shape of the opening portions 12 and 22 as well as a device pattern (not shown). Subsequently, the resist film 104 is removed and the substrate is cleaned.

Then, as shown in FIG. 21D, an i-ray photo resist 151 is applied. Subsequently, to mask the area except for the opening portions of the phase shift mark, a writing operation is performed using a laser writing apparatus. Furthermore, a developer is used to carry out development to obtain a resist pattern 151.

Then, as shown in FIG. 21E, the transparent substrate 101 is etched using the resist pattern 151 and the opaque film 103 as a mask. This allows the transparent substrate 101 to be etched only in the opening portions of the phase shift mark to form holes 152.

Then, as shown in FIG. 21F, the resist 151 is removed and the substrate is cleaned.

Then, as shown in FIG. 21G, an i-ray photo resist 153 is applied. Subsequently, to mask the opening portions in the reference mark area 10, Cr opaque frame portions, and other Cr pattern portions, the laser writing apparatus is used to write in the resist film 153. Furthermore, a developer is used to carry out development to obtain a resist pattern 153.

Then, as shown in FIG. 21H, the resist pattern 153 is used as a mask to wet-etch the opaque film 103. Subsequently, the resist film 153 is removed and the substrate is cleaned.

A mask configured as shown in FIGS. 20 and 21H is obtained as described above. Since the transparent substrate 101 is etched to form the holes 152, it is possible to give a phase difference of −90° to exposure light passing through the opening portions in the phase shift mark area 20 relative to exposure light passing through the opening portions in the reference mark area 10.

However, with the above conventional manufacturing method, extra lithography and etching steps such as those shown in FIGS. 21D to 21F are required to form the holes 152 used to create a phase difference of 90°. This sharply increases the time required for a manufacturing process, thus affecting manufacturing costs and TAT.

Thus, the conventional focus monitor mask requires extra lithography steps to obtain a phase difference of 90°. This increases the time required for the manufacturing process, thus increasing manufacturing costs.

BRIEF SUMMARY OF THE INVENTION

According to a first aspect of the present invention, there is provided a mask comprising: a first area including a first surrounding area in which a halftone phase shift film or a stacked film of a halftone phase shift film and an opaque film is provided on a transparent substrate, and a first opening area surrounded by the first surrounding area; and a second area including a second surrounding area in which a halftone phase shift film is provided on the transparent substrate and a second opening area surrounded by the second surrounding area, wherein a transparent film is provided in at least a part of the second opening area, the transparent film being configured to give a predetermined phase difference to exposure light passing through that part of the second opening area in which the transparent film is provided relative to exposure light passing through the second surrounding area.

According to a second aspect of the present invention, there is provided a mask comprising; a first area including a first surrounding area in which a halftone phase shift film or a stacked film of a halftone phase shift film and an opaque film is provided on a transparent substrate, and a first opening area surrounded by the first surrounding area; and a second area including a second surrounding area in which a halftone phase shift film is provided on the transparent substrate and a second opening area surrounded by the second surrounding area, wherein at least a part of the halftone phase shift film in the second surrounding area is thinner than the halftone phase shift film in the first surrounding area, and is configured to give a predetermined phase difference to exposure light passing through that part of the second surrounding area which includes the thinner part of the halftone phase shift film relative to exposure light passing through the second opening area.

According to a third aspect of the present invention, there is provided a method of manufacturing a mask comprising: providing, in a first area, a first surrounding area in which a halftone phase shift film or a stacked film of a halftone phase shift film and an opaque film is provided on a transparent substrate and a first opening area surrounded by the first surrounding area, and, in a second area, a second surrounding area in which a halftone phase shift film is provided on the transparent substrate and a second opening area surrounded by the second surrounding area; and forming a transparent film in a selected area including at least a part of the second opening area, and giving a predetermined phase difference to exposure light passing through that part of the second opening area in which the transparent film is provided relative to exposure light passing through the second surrounding area.

According to a fourth aspect of the present invention, there is provided a method of manufacturing a mask comprising: providing, in a first area, a first surrounding area in which a halftone phase shift film or a stacked film of a halftone phase shift film and an opaque film is provided on a transparent substrate and a first opening area surrounded by the first surrounding area, and, in a second area, a second surrounding area in which a halftone phase shift film is provided on the transparent substrate and a second opening area surrounded by the second surrounding area; and supplying an etching source to a selected area including at least a part of the second opening area to etch the transparent substrate in the selected area, and giving a predetermined phase difference to exposure light passing through that part of the second opening area which includes the etched part of the transparent substrate relative to exposure light passing through the second surrounding area.

According to a fifth aspect of the present invention, there is provided a method of manufacturing a mask comprising: providing, in a first area, a first surrounding area in which a halftone phase shift film or a stacked film of a halftone phase shift film and an opaque film is provided on a transparent substrate and a first opening area surrounded by the first surrounding area, and, in a second area, a second surrounding area in which a halftone phase shift film is provided on the transparent substrate and a second opening area surrounded by the second surrounding area; and supplying an etching source to a selected area including at least a part of the second surrounding area to etch the halftone phase shift film in the selected area, and giving a first phase difference to exposure light passing through that part of the second surrounding area which includes the etched part of the halftone phase shift film relative to exposure light passing through the second opening area.

BRIEF DESCRIPTION OF THE SEVERAL VIEWS OF THE DRAWING

FIGS. 14A to 14D are sectional views showing manufacturing steps for a mask according to a fifth embodiment of the present invention;

FIG. 15 is a graph showing the relationship between defocus and a size difference according to the fifth embodiment of the present invention;

DETAILED DESCRIPTION OF THE INVENTION

Embodiments of the present invention will be described below with reference to the drawings.

Embodiment 1

First, a first embodiment of the present invention will be described.

Figure 1:
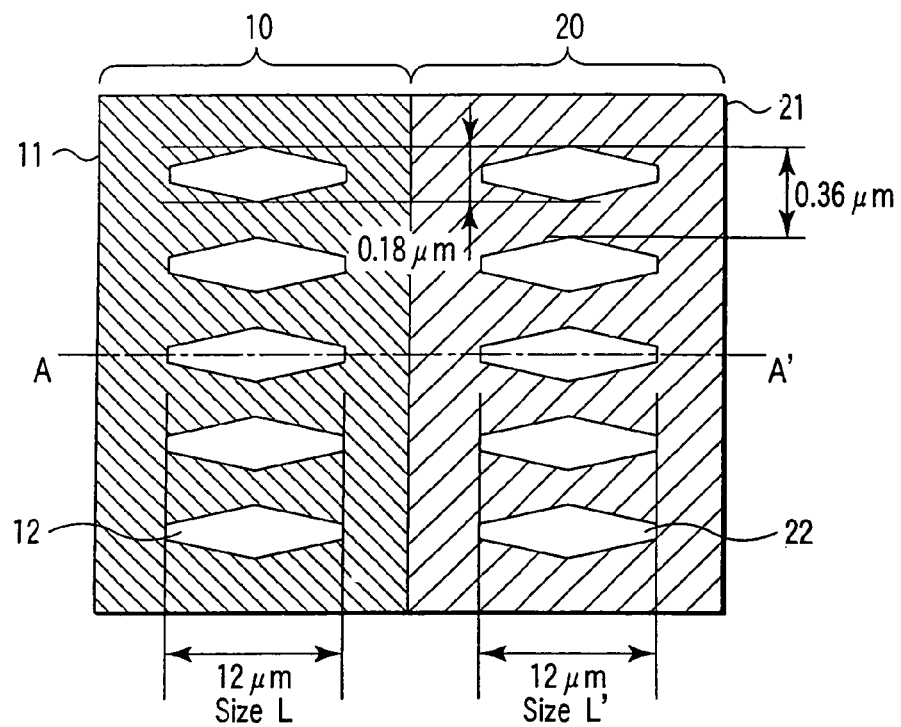
FIG. 1 is a diagram schematically showing a planar configuration of a mask pattern formed area in a mask according to embodiments of the present invention.

FIG. 1 is a diagram schematically showing a planar configuration of a mark pattern formed area according to the present embodiment.

The mark pattern forming area includes a reference mark area 10 and a phase shift mark area 20. The reference mark area 10 has a surrounding portion (surrounding area) 11 comprising an opaque portion or a halftone portion and five opening portions (opening areas) 12 surrounded by the surrounding portion 11. The phase shift mark area 20 has a surrounding portion 21 comprising a halftone portion and five opening portions 22 surrounded by the surrounding portion 21. The opening portions 12 and 22 are used as focus monitor marks and have the same diamond-like (rhomboid-like) planar shape. There is a phase. difference of 90° between exposure light passing through the opening portions 22 and exposure light passing through the surrounding portion 21. In the present example, each opening is 12 µm in length in the direction of an X axis, 0.18 µm in width in the direction of a Y-axis, and 0.36 µm in pitch in the direction of the Y axis, in terms of sizes on a wafer.

Figure 4:
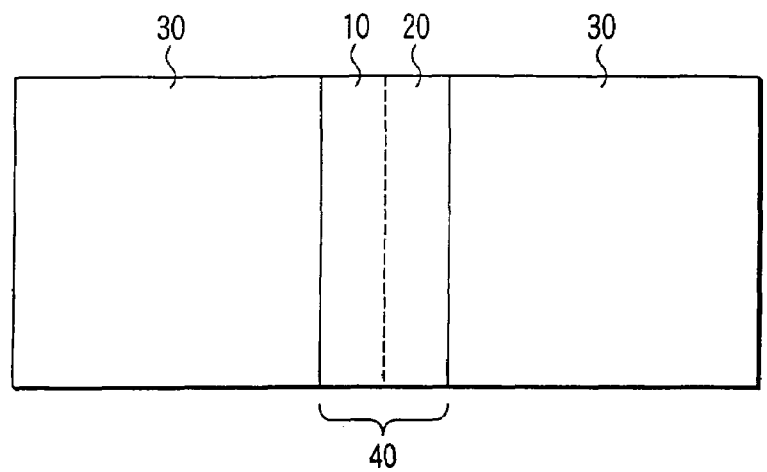
FIG. 4 is a diagram showing areas in a mask according to the embodiments of the present invention.

The mark pattern forming area including the reference mark area 10 and phase shift mark area 20 may be provided in a device pattern forming area. However, it is preferably located in a dicing area 40 between device pattern forming areas 30 as shown in FIG. 4. By forming the mask pattern forming area in the dicing area 40, it is possible to avoid an increase in the size of the device pattern forming area 30, in which a real device is to be formed.

Now, with reference to FIGS. 2A to 2F, description will be given of a manufacturing method for a mask having a pattern such as the one shown in FIG. 1. FIGS. 2A to 2F schematically show cross sections taken along line A-A' in FIG. 1. With the manufacturing method according to the present embodiment, a pipette and a dropping apparatus are used to apply droplets for an SOG (Spin On Glass) film to the opening portions 22 in the phase shift mark area 20 to form a transparent film in the opening portions 22.

Figure 2A:
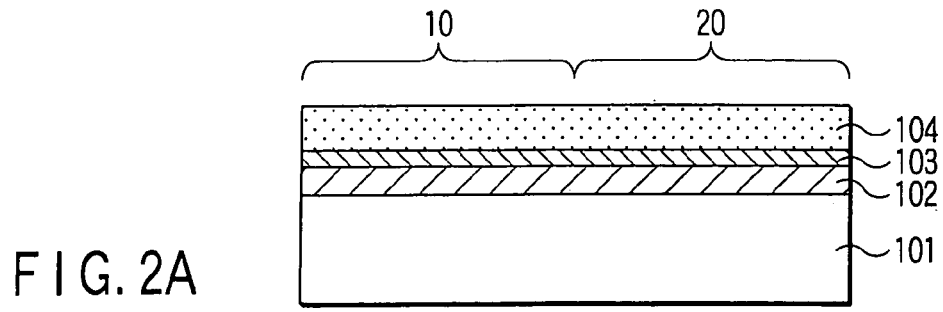
FIGS. 2A to 2F are sectional views showing manufacturing steps for a mask according to a first embodiment of the present invention.

First, as shown in FIG. 2A, a quartz substrate of 6×6 inches is provided as a transparent substrate 101. An MoSiOx film of thickness 100 nm is formed on the transparent substrate 101 as a halftone-phase shift film 102. Subsequently, a Cr film of thickness 60 nm is formed on the halftone phase shift film 102 as an opaque film 103. Furthermore, a chemically amplified positive type resist 104 is applied to the opaque film 103 to a thickness of 600 nm. The halftone phase shift film 102 inverses the phase of exposure light incident to the halftone phase shift film 102 to allow the light to exit the film 102. That is, the halftone phase shift film 102 sets a phase difference of 180° between exposure light incident to the halftone phase shift film 102 and exposure light exiting the halftone phase shift film 102. That halftone phase shift film 102 has a transmittance of, for example, 6%.

Figure 2B:
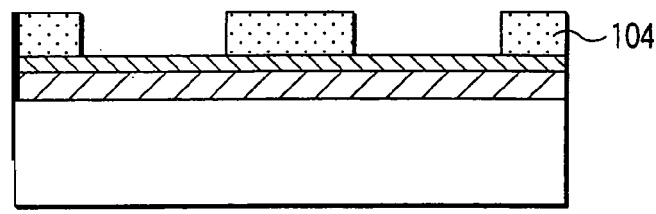

Then, as shown in FIG. 2B, focus monitor marks are written in the resist film 104 in the reference mark area 10 and phase shift mark area 20. At this time, a device pattern is also written in the device pattern forming area (not shown). In this case, an electron beam writing apparatus with an acceleration voltage of 50 KeV is used. However, a laser beam writing apparatus or a photo repeater may be used. Subsequently, the substrate is baked at 120° C. for 90 seconds. Then, an alkali developer with a normality of 0.21 is used to carry out spray development for 60seconds. Thus, a resist pattern 104 is formed.

Figure 2C:
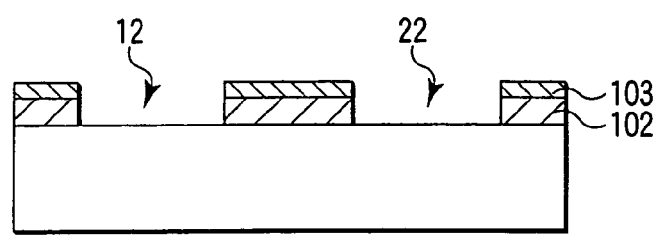

Then, as shown in FIG. 2C, the opaque film 103 and the halftone phase shift film 102 are sequentially etched using the resist pattern 104 as a mask. This etching forms a focus monitor mark pattern corresponding to the planar shape of the opening portions 12 and 22 as well as a device pattern (not shown). Subsequently, the resist film 104 is removed using $O_2$ ashing and a mixed liquid of sulfuric acid and hydrogen peroxide. Then, the substrate is cleaned.

Figure 2D:
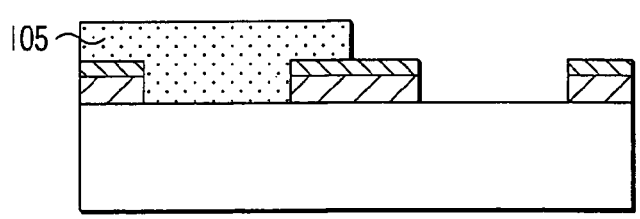

Then, as shown in FIG. 2D, an i-ray photo resist 105 is applied. Subsequently, to mask the opening portions in the reference mark area 10, Cr opaque frame portions, and other Cr pattern portions, a laser writing apparatus is used to write in the resist film 105. Furthermore, an alkali developer with a normality of 0.21 is used to carry out spray development for 60 seconds. Thus, a resist pattern 105 is formed.

Figure 2E:
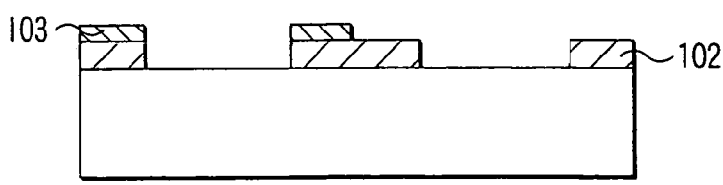

Then, as shown in FIG. 2E, the resist pattern 105 is used as a mask to wet-etch the opaque film 103. Subsequently, the resist film 105 is removed using $O_2$ ashing and a mixed liquid of sulfuric acid and hydrogen peroxide. Then, the substrate is cleaned.

Figure 3:
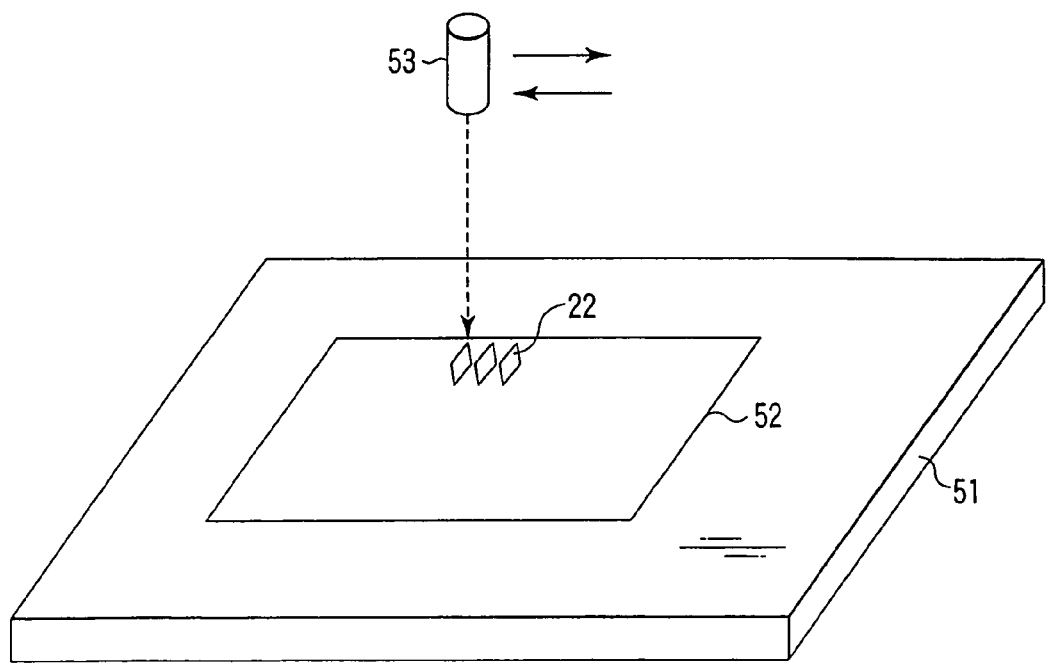
FIG. 3 is a view schematically illustrating a dropping apparatus according to the embodiments of the present invention.
Figure 2F:
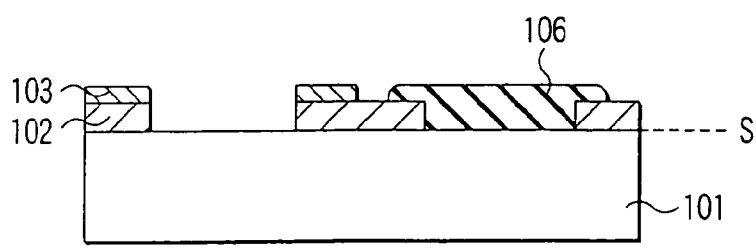

Subsequently, as shown in FIG. 2F, as a transparent film 106, an SOG film is formed selectively in that part of the phase shift mark area 20 which includes the opening portions. The SOG film is formed using a dropping apparatus such as the one shown in FIG. 3. The dropping apparatus comprises an auxiliary plate 51 on which a mask plate 52 is placed and a chemical liquid supply nozzle 53 that supplies a chemical liquid to the mask plate 52. The chemical liquid supply nozzle 53 and the mask plate 52 can be relatively moved. By adjusting the positional relationship between the chemical liquid supply nozzle 53 and the mask plate 52, a chemical liquid can be selectively supplied to a target area. This dropping apparatus is used to drop an SOG material liquid in that part of the phase shift mark area 20 which includes the opening portions 22. Subsequently, the substrate is heated at 450° C. for 30 minutes and then cleaned.

As described above, a mask configured as shown in FIGS. 1 and 2F is obtained. As a result, it is possible to give a phase difference of +90° to the area in which the transparent film 106 is formed as compared with a reference surface S (an unprocessed part of the surface of the transparent substrate 101). specifically, it is possible to give a phase difference of +90° to exposure light passing through the area in which the transparent film 106 is formed relative to exposure light passing through the opening portion 12 in the reference mark area 10.

Figure 22:
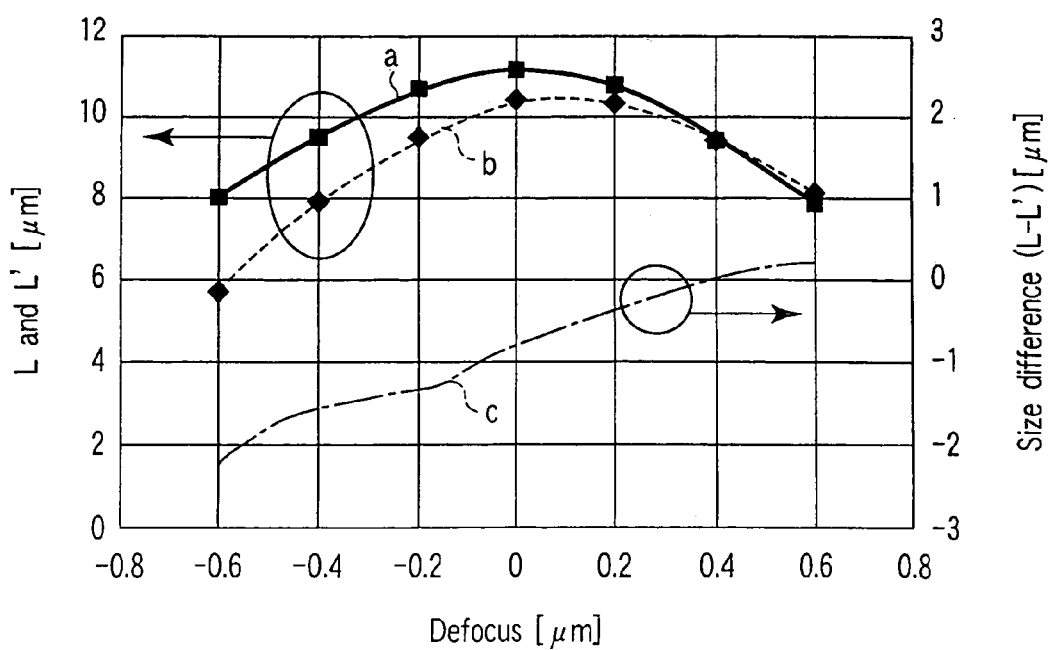
FIG. 22 is a graph showing the relationship between defocus and a size difference.
Figure 21A:
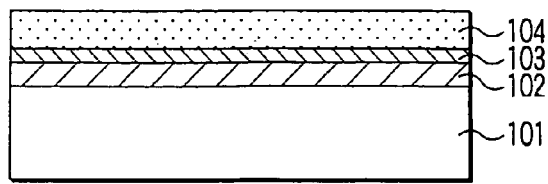
FIGS. 21A to 21H are sectional views showing manufacturing steps for a mask according to the prior art.
Figure 21B:
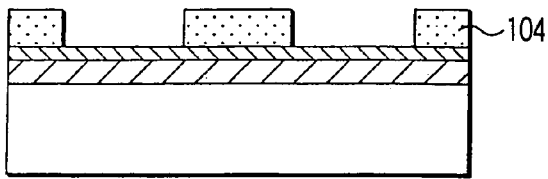
Figure 21C:
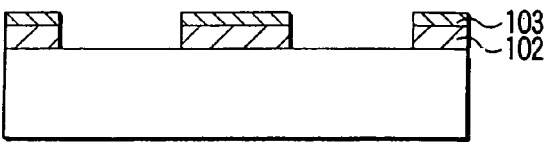
Figure 21D:
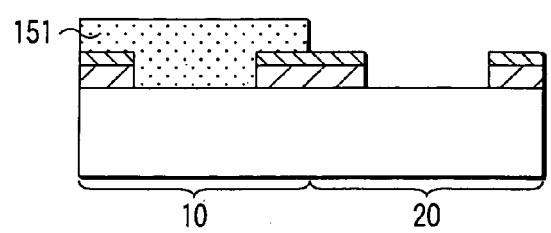
Figure 21E:
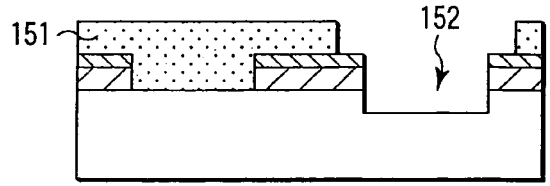
Figure 21F:
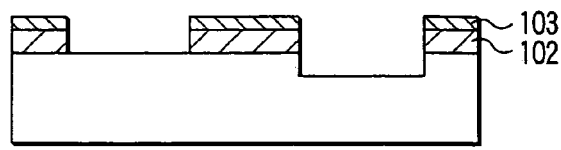
Figure 21G:
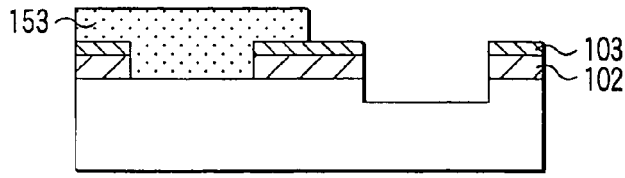
Figure 21H:
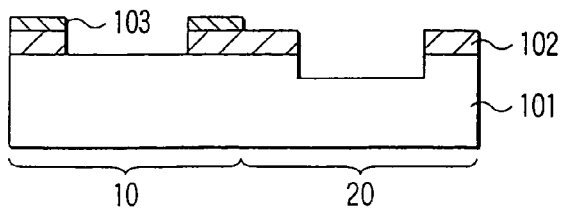

Consequently, when the above mask is used to transfer patterns to a wafer (semiconductor substrate), there occurs a size difference between a focus monitor pattern on the wafer corresponding to the opening portions 12 in the reference mark area 10 and a focus monitor pattern on the wafer corresponding to the opening portions 22 in the phase shift mark area 20. As a result, the relationship between the size difference between both patterns and the magnitude of defocus is similar to that shown in the Related Art section with reference to FIG. 22. Thus, as described in the Related Art section, by determining a calibration curve indicative of the relationship between the pattern size difference (the longitudinal size difference between the focus monitor patterns) and the magnitude of defocus and subsequently determining the pattern size difference on the wafer after exposure and development, the magnitude of defocus can be obtained including its direction.

As described above, according to the present embodiment, to obtain a phase difference of 90°, the transparent film 106 is selectively formed at the opening portions 22 in the phase shift mark area 20. The transparent film 106 is formed by selectively dropping the material liquid for the transparent film 106 at the opening portions 22. This eliminates the needs for cumbersome photolithographic steps. Therefore, a precise mask can be formed using simple steps, thus avoiding an increase in manufacturing costs or TAT.

In the above manufacturing steps shown in FIGS. 2A to 2F, described above, the surrounding portion 11 in the reference mark area 10 is formed of an opaque portion in which the stacked film of the halftone phase shift film 102 and opaque film 103 is formed on the transparent substrate 101. However, the surrounding portion 11 may be formed of a halftone portion in which only halftone phase shift film 102 is formed on the transparent substrate 101 with the opaque film 103 omitted.

Figure 5:
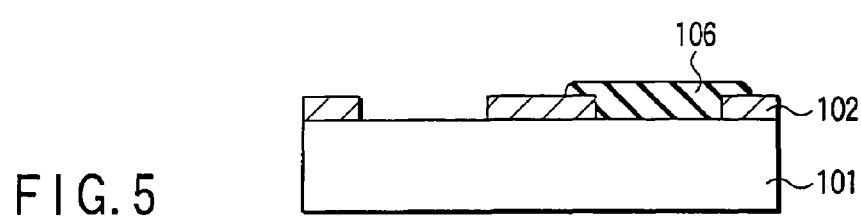
FIG. 5 is a sectional view showing a variation of the mask according to the first embodiment of the present invention.

In this case, when the laser is used to write in the resist film 105 during the step shown in FIG. 2D, the resist 105 in the reference mark area 10 may also be irradiated with laser beams. Then, during a development step, the resist 105 may be removed from the reference mark area 10. In this case, the reference mark area 10 is not masked by the resist. As a result, during the step shown in FIG. 2E, the opaque film 103 in the reference mark area 10 is also etched to obtain a structure in which the halftone phase shift film 102 is exposed. Then, during the step shown in FIG. 2F, SOG droplets may be applied only to within the phase shift mark area 20. This provides a structure such as the one shown in FIG. 5.

Also in this case, a calibration curve can be obtained which is similar to the one obtained if the opaque film is formed in the reference mark area 10. Accordingly, by determining the size difference between the patterns on the wafer after exposure and development, the magnitude of defocus can be obtained including its direction.

Further, in the present embodiment, the material for the transparent film 106 is an SOG material such as poly methyl siloxane which is easily hardened when heated and which is not degraded even when cleaned with an oxide or irradiated with ultraviolet light. However, other materials may be used provided that they have desired properties.

Embodiment 2

Now, a second embodiment of the present invention will be described.

The basic planar configuration of this embodiment is similar to the one shown in FIGS. 1 and 4 for the first embodiment. Accordingly, its detailed description is omitted.

With reference to FIGS. 6A to 6D, description will be given below of a manufacturing method for a mask according to the present embodiment. FIGS. 6A to 6D schematically show cross sections taken along line A-A' in FIG. 1. Components corresponding to the configuration shown FIGS. 2A to 2F for the first embodiment are denoted by the same reference numerals.

With the manufacturing method according to the present embodiment, the pipette and the dropping apparatus are used to drop a wet etchant in the opening portions 22 in the phase shift mark area 20 to form holes in the opening portions 22 of the transparent substrate 101.

Figure 6A:
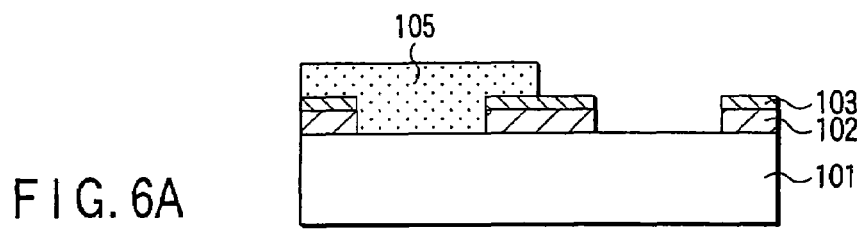
FIGS. 6A to 6D are sectional views showing manufacturing steps for a mask according to a second embodiment of the present invention.

First, a structure such as the one shown in FIG. 6A is formed by executing steps similar to those shown in FIGS. 2A to 2D for the first embodiment.

Figure 6B:
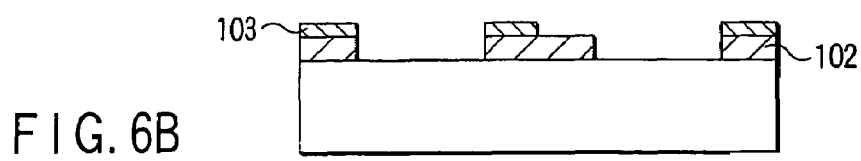

Then, as shown in FIG. 6B, the resist pattern 105 is used as a mask to wet-etch the opaque film 103. Subsequently, the resist film 105 is removed using $O_2$ ashing and a mixed liquid of sulfuric acid and hydrogen peroxide. Then, the substrate is cleaned.

Figure 6C:
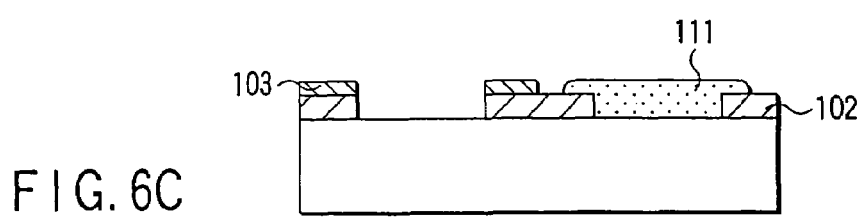

Then, as shown in FIG. 6C, a wet etchant 111 is selectively dropped in that area of the phase shift mark area 20 which includes the opening portions. The substrate is then cleaned. The dropping apparatus used for the wet etchant 111 may have a basic configuration similar to that of the apparatus shown in FIG. 3 for the first embodiment. Specifically, this dropping apparatus is used to drop the wet etchant through the chemical liquid supply nozzle selectively in that area of the phase shift mark area 20 which includes the opening portions 22.

Figure 6D:
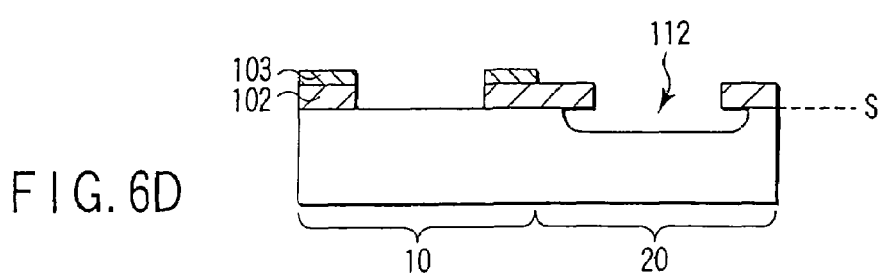

As shown in FIG. 6D, the above etching step forms selectively forms holes 112 in those areas of the phase shift mark area 20 each of which includes the opening portion 22. The depth of the holes 112 can be adjusted on the basis of the time elapsing after the wet etchant has been dropped and before a rinse liquid is dropped. The wet etchant may be a 20% diluent of $NH_4F$, and the rinse liquid may be water.

As described above, a mask configured as shown in FIGS. 1 and 6D is obtained. As a result, it is possible to give a phase difference of −90° to the area in which the hole 112 is formed as compared with a reference surface S. Specifically, it is possible to give a phase difference of −90° to exposure light passing through the area in which the hole 112 is formed relative to exposure light passing through the opening portion 12 in the reference mark area 10.

Consequently, when the above mask is used to transfer patterns to a wafer (semiconductor substrate), there occurs a size difference between a focus monitor pattern on the wafer corresponding to the opening portions 12 in the reference area 10 and a focus monitor pattern on the wafer corresponding to the opening portions 22 in the phase shift mark area 20. Thus, as already described, by determining a calibration curve indicative of the relationship between the pattern size difference and the magnitude of defocus and subsequently determining the pattern size difference on the wafer after exposure and development, the magnitude of defocus can be obtained including its direction.

As described above, according to the present embodiment, to obtain a phase difference of 90°, the holes 112 are selectively formed in the opening portions 22 in the phase shift mark area 20. The holes 112 are formed by selectively dropping the wet etchant at the opening portions 22. This eliminates the needs for cumbersome photolithographic steps. Therefore, a precise mask can be formed using simple steps, thus avoiding an increase in manufacturing costs or TAT.

In the above manufacturing steps shown in FIGS. 6A to 6D, described above, the surrounding portion 11 in the reference mark area 10 is formed of an opaque portion in which the stacked film of the halftone phase shift film 102 and opaque film 103 is formed on the transparent substrate 101. However, the surrounding portion 11 may be formed of a halftone portion in which the halftone phase shift film 102 is formed on the transparent substrate 101 with the opaque film 103 omitted.

Figure 7:
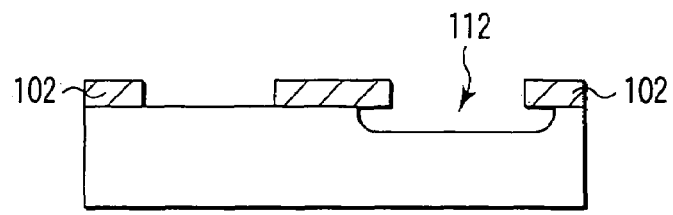
FIG. 7 is a sectional view showing a variation of the mask according to the second embodiment of the present invention.

In this case, when the laser is used to write in the resist film 105 during the step shown in FIG. 6A, the resist 105 in the reference mark area 10 may also be irradiated with laser beams. Then, during a development step, the resist 105 may be removed from the reference mark area 10. In this case, the reference mark area 10 is not masked by the resist. As a result, during the step shown in FIG. 6B, the opaque film 103 in the reference mark area 10 is also etched to obtain a structure in which the halftone phase shift film 102 is exposed. Then, during the step shown in FIG. 6C, the wet etchant may be applied only to within the phase shift mark area 20. This provides a structure such as the one shown in FIG. 7.

Also in this case, a calibration curve can be obtained which is similar to the one obtained if the opaque film is formed in the reference mark area 10. Accordingly, by determining the size difference between the patterns on the wafer after exposure and development, the magnitude of defocus can be obtained including its direction.

Further, in the present embodiment, when the hole 112 is formed, $NH_4F$ is used as the wet etchant, and water is used as the rinse liquid. However, other etchants or rinse liquids may be used provided that they have desired properties.

Embodiment 3

Now, a third embodiment of the present invention will be described.

The basic planar configuration of this embodiment is similar to the one shown in FIGS. 1 and 4 for the first embodiment. Accordingly, its detailed description is omitted.

With reference to FIGS. 8A to 8D, description will be given below of a manufacturing method for a mask according to the present embodiment. FIGS. 8A to 8D schematically show cross sections taken along line A-A' in FIG. 1. Components corresponding to the configuration shown FIGS. 2A to 2F for the first embodiment are denoted by the same reference numerals.

With the manufacturing method according to the present embodiment, the opening portions 22 in the phase shift mark area 20 are etched by irradiation with charged particles such as ion beams, to form holes in the opening portions 22 of the transparent substrate 122.

Figure 8A:
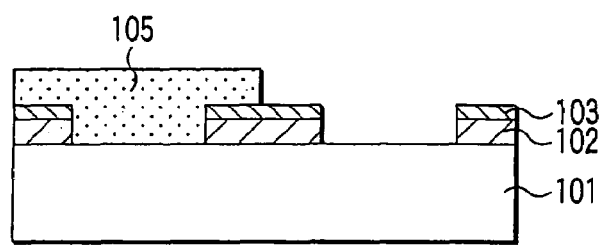
FIGS. 8A to 8D are sectional views showing manufacturing steps for a mask according to a third embodiment of the present invention.

First, a structure such as the one shown in FIG. 8A is formed by executing steps similar to those shown in FIGS. 2A to 2D for the first embodiment.

Figure 8B:
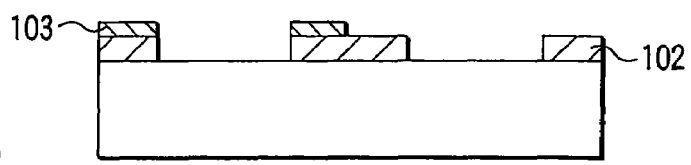

Then, as shown in FIG. 8B, the resist pattern 105 is used as a mask to wet-etch the opaque film 103. Subsequently, the resist film 105 is removed using $O_2$ ashing and a mixed liquid of sulfuric acid and hydrogen peroxide. Then, the substrate is cleaned.

Figure 8C:
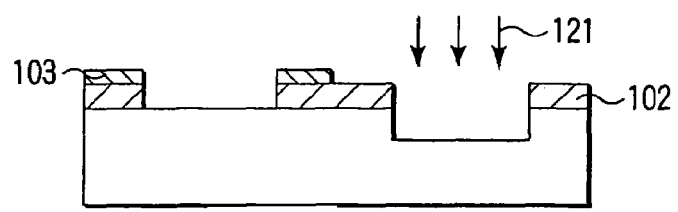

Then, as shown in FIG. 8C, an FIB (Focused Ion Beam) processing apparatus is used to irradiate the areas corresponding to the opening portions in the phase shift mark area 10 with Ga ion beams 121 to etch the transparent substrate 101. Ga ion irradiation conditions are, for example, an acceleration voltage (the energy of ion beams) of 20 kV and a current of 15 pA. If quartz has a-refractive index of 1.508, an etching depth required to change the phase of exposure light of wavelength 248 nm by 90° is 122 nm. The amount of ion beams required to obtain this depth is $5.7 \times 10^{-2} C/cm^2$. To set an irradiated area, the inventors irradiated a 20-um square area including the mark portions with ion beams and observed secondary electron images to determine automatically the quartz substrate portion and the halftone portion. The amount of ion beams applied during observations is much smaller than that of ion beams required to etch the quartz substrate.

Figure 8D:
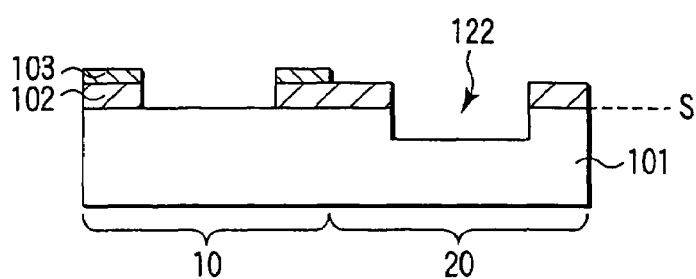

As shown in FIG. 8D, the above ion beam irradiating step forms holes 122 corresponding to the opening portions in the phase shift mark area 20.

As described above, a mask configured as shown in FIGS. 1 and 8D is obtained. As a result, it is possible to give a phase difference of −90° to the area in which the hole 122 is formed as compared with a reference surface S. Specifically, it is possible to give a phase difference of −90° to exposure light passing through the area in which the hole 122 is formed relative to exposure light passing through the opening portion 12 in the reference mark area 10.

Consequently, when the above mask is used to transfer patterns to a wafer (semiconductor substrate), there occurs a size difference between a focus monitor pattern on the wafer corresponding to the opening portions 12 in the reference area 10 and a focus monitor pattern on the wafer corresponding to the opening portions 22 in the phase shift mark area 20. Thus, as already described, by determining a calibration curve indicative of the relationship between the pattern size difference and the magnitude of defocus and subsequently determining the pattern size difference on the wafer after exposure and development, the magnitude of defocus can be obtained including its direction.

As described above, according to the present embodiment, to obtain a phase difference of 90°, the holes 122 are selectively formed at the opening portions 22 in the phase shift mark area 20. The holes 122 are formed by selectively irradiating the opening portions 22 with charged particles such as ion beams. This eliminates the needs for cumbersome photolithographic steps. Therefore, a precise mask can be formed using simple steps, thus avoiding an increase in manufacturing costs or TAT.

In the above embodiment, the step of forming the holes 122 as shown in FIGS. 8C and 8D may be executed before the step shown in FIG. 8A (after the step shown in FIG. 2C) or after the step shown in FIG. 8A (before the step shown in FIG. 8B).

Figure 10A:
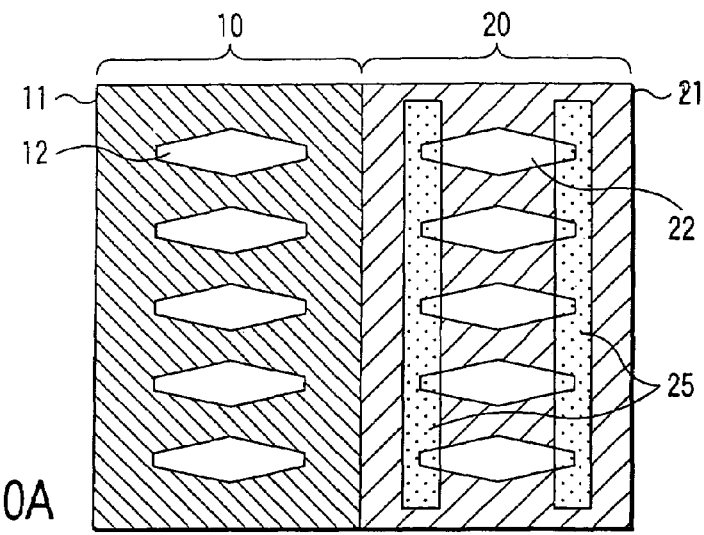
FIGS. 10A and 10B are sectional views showing another variations of the masks according to the third embodiment of the present invention.
Figure 10B:
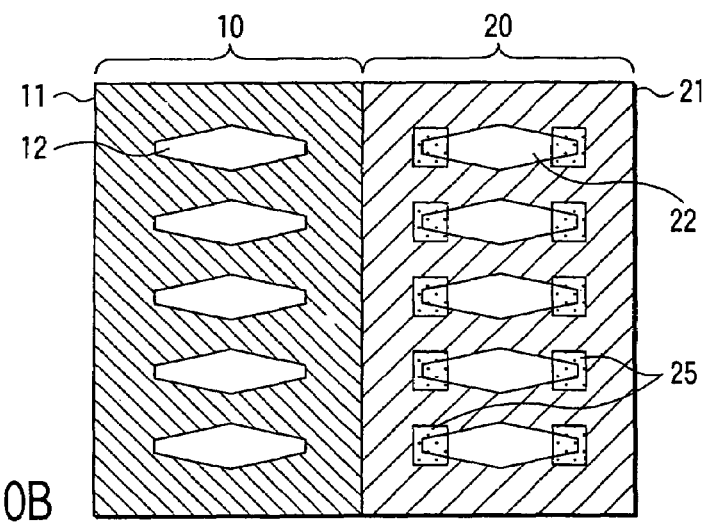

Further, in the above embodiment, if the holes 122 are formed using ion beams, the entire area including the five opening portions 22 in the phase shift mark area 20 may be irradiated with ion beams. However, an area including at least a part of each opening portion 22 has only to be irradiated with ion beams. FIGS. 10A and 10B show such an example. An area including the tips of the opening portions 22 may be an ion beam irradiation area 25. In this case, the effects of the focus monitor can also be produced. Specifically, it is sufficient to form holes each extending up to about 6 μm from the tip of the monitor mark.

Further, in the above manufacturing steps shown in FIGS. 8A to 8D, described above, the surrounding portion 11 in the reference mark area 10 is formed of an opaque portion in which the stacked film of the halftone phase shift film 102 and opaque film 103 is formed on the transparent substrate 101. However, the surrounding portion 11 may be formed of a halftone portion in which the halftone phase shift film 102 is formed on the transparent substrate 101 with the opaque film 103 omitted.

Figure 9:
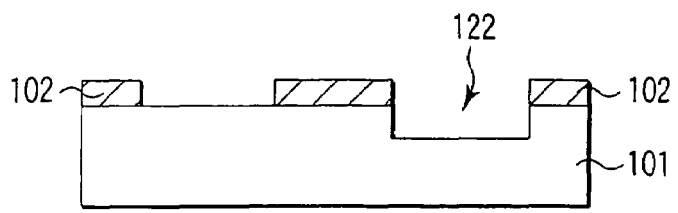
FIG. 9 is a sectional view showing a variation of the mask according to the third embodiment of the present invention.

In this case, when the laser is used to write in the resist film 105 during the step shown in FIG. 8A, the resist 105 in the reference mark area 10 may also be irradiated with laser beams. Then, during a development step, the resist 105 may be removed from the reference mark area 10. In this case, the reference mark area 10 is not masked by the resist. As a result, during the step shown in FIG. 8B, the opaque film 103 in the reference mark area 10 is also etched to obtain a structure in which the halftone phase shift film 102 is exposed. Then, during the step shown in FIG. 8C, the ion beam may be applied only to within the phase shift mark area 20. This provides a structure such as the one shown in FIG. 9.

Also in this case, a calibration curve can be obtained which is similar to the one obtained if the opaque film is formed in the reference mark area 10. Accordingly, by determining the size difference between the patterns on the wafer after exposure and development, the magnitude of defocus can be obtained including its direction.

Embodiment 4

Now, a fourth embodiment of the present invention will be described.

The basic planar configuration of this embodiment is similar to the one shown in FIGS. 1 and 4 for the first embodiment. Accordingly, its detailed description is omitted.

With reference to FIGS. 11A to 11D, description will be given below of a manufacturing method for a mask according to the present embodiment. FIGS. 11A to 11D schematically show cross sections taken along line A-A' in FIG. 1. Components corresponding to the configuration shown FIGS. 2A to 2F for the first embodiment are denoted by the same reference numerals.

With the manufacturing method according to the present embodiment, the surrounding portion 21 of the phase shift mark area 20 is etched by irradiation with charged particles such as ion beams, to reduce the thickness of the halftone phase shift film 102 in the surrounding portion 21.

Figure 11A:
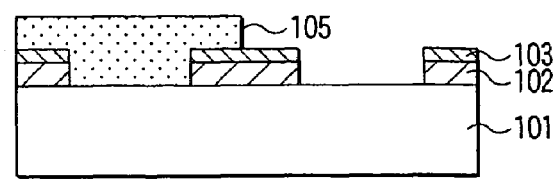
FIGS. 11A to 11D are sectional views showing manufacturing steps for a mask according to a fourth embodiment of the present invention.

First, a structure such as the one shown in FIG. 11A is formed by executing steps similar to those shown in FIGS. 2A to 2D for the first embodiment.

Figure 11B:
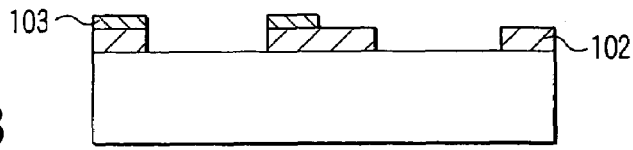

Then, as shown in FIG. 11B, the resist pattern 105 is used as a mask to wet-etch the opaque film 103. Subsequently, the resist film 105 is removed using $O_2$ ashing and a mixed liquid of sulfuric acid and hydrogen peroxide. Then, the substrate is cleaned.

Figure 11C:
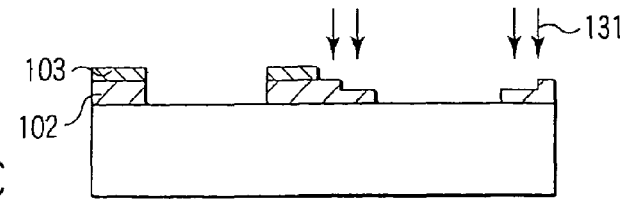

Then, as shown in FIG. 11C, the FIB processing apparatus is used to irradiate selectively an area including a part of the surrounding portion of the phase shift mark area 20, with Ga ion beams 131. Thus, the halftone phase shift film 102 is etched. The Ga ion irradiation conditions are, for example, an acceleration voltage (the energy of ion beams) of 20 kV and a current of 15 pA. The etching depth is 50 nm, which is half the thickness of the halftone phase shift film 102, 100 nm. The amount of ion beams required to obtain this depth is $7.7 \times 10^{-3} C/cm^2$. To set an irradiation area, the inventors irradiated a 20-um square area including the mark portions with ion beams and observed secondary electron images to determine automatically the quartz substrate portion and the halftone portion. The amount of ion beams applied during observations is much smaller than that of ion beams required to etch the halftone phase shift film.

Figure 11D:
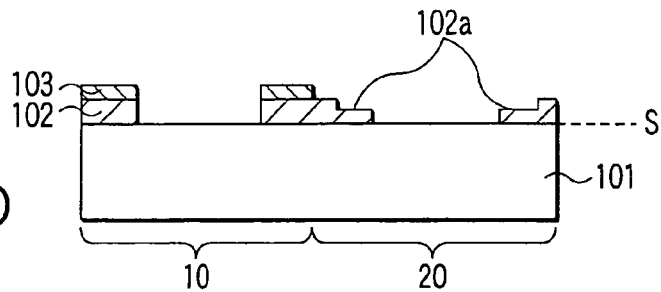

As shown in FIG. 11D, the above ion beam irradiating step forms thinner parts 102a of the halftone phase shift film 102, in the part of the surrounding portion of the phase shift mark area 20.

As described above, a mask configured as shown in FIGS. 1 and 11D is obtained. As a result, it is possible to give a phase difference of 90° (+90° or −90°; in the description below, +90° will be used) to the thinner part 102a of the halftone phase shift film 102 as compared with a reference surface S. Further, the halftone phase shift film 102 provides a phase difference of 180°. Accordingly, if the reference is the phase of exposure light passing through the area in which the thickness of the halftone phase shift film 102 has not been reduced, the phase of exposure light passing through the thinner part 102a of the halftone phase shift film is −90°. On the other hand, if the reference is the phase of exposure light passing through the opening portion 12 in the reference mark area 10, the phase of exposure light passing through the thinner part 102a of the halftone phase shift film is +90°.

Consequently, when the above mask is used to transfer patterns to a wafer (semiconductor substrate), there occurs a size difference between a focus monitor pattern on the wafer corresponding to the opening portions 12 in the reference mark area 10 and a focus monitor pattern on the wafer corresponding to the opening portions 22 in the phase shift mark area 20. Thus, as already described, by determining a calibration curve indicative of the relationship between the pattern size difference and the magnitude of defocus and subsequently determining the pattern size difference on the wafer after exposure and development, the magnitude of defocus can be obtained including its direction.

As described above, according to the present embodiment, to obtain a phase difference of 90°, the thinner parts 102a of the halftone phase shift film are formed adjacent to the respective opening portions 22, in the surrounding portion 21 of the phase shift mark area 20. The thinner parts 102a are formed by selective irradiation with charged particles such as ion beams. This eliminates the needs for cumbersome photolithographic steps. Therefore, a precise mask can be formed using simple steps, thus avoiding an increase in manufacturing costs or TAT.

Figure 13A:
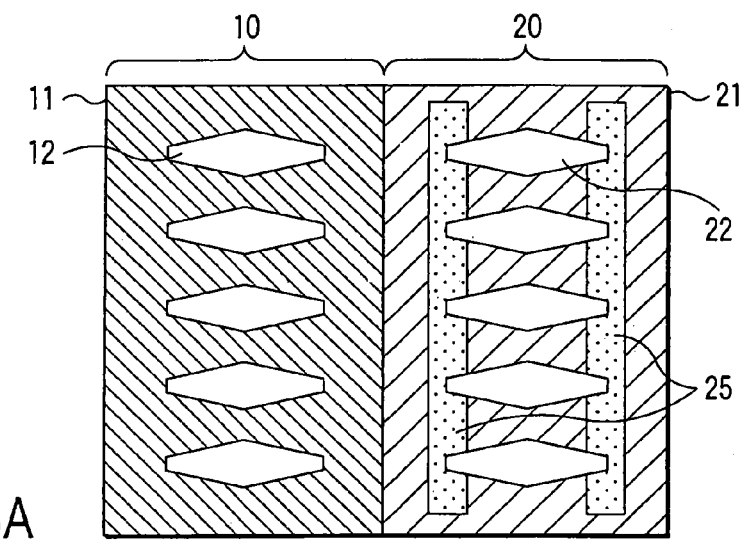
FIGS. 13A and 13B are sectional views showing another variations of the masks according to the fourth embodiment of the present invention.
Figure 13B:
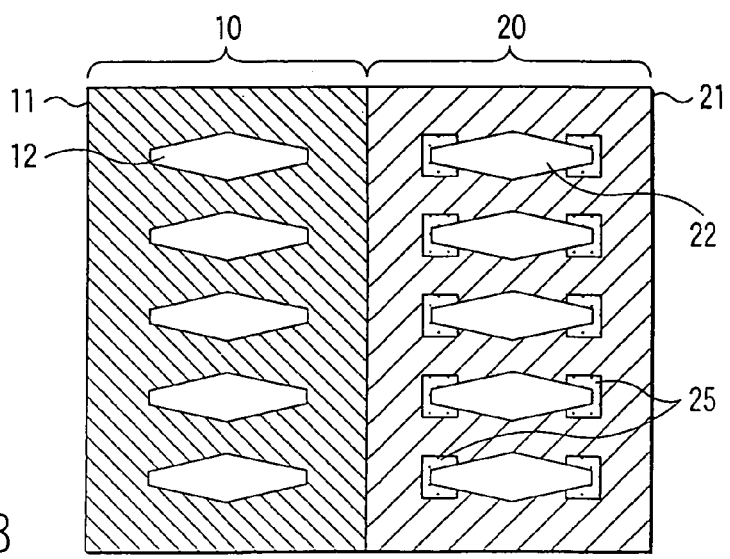

In the above embodiment, if ion beams are used to form the thinner parts 102a of the halftone phase shift film, the outside area of the five opening portions 22 in the phase shift mark area 20 may be entirely irradiated with ion beams. However, at least a part of the outside area of each opening portion 22 has only to be irradiated with ion beams. FIGS. 13A and 13B show such an example. An area corresponding to the outside of the tips of the opening portions 22 may be the ion beam irradiation area 25. In this case, the effects of the focus monitor can also be produced. Specifically, it is sufficient to process the halftone phase shift film up to about 6 μm from the tips of the marks.

Further, in the above embodiment, only the halftone phase shift film 102 in the phase shift mark area 20 is selectively etched by irradiation with ion beams. However, the quartz substrate may be simultaneously irradiated with ion beams. However, since the quartz substrate is simultaneously etched, the halftone phase shift film must be etched by more than 50 nm before a phase difference of 90° can be obtained. The etching depth may be set in view of differences, in etching speed and refractive index between the halftone phase shift film and the quartz substrate.

Furthermore, in the above manufacturing steps shown in FIGS. 11A to 11D, described above, the surrounding portion 11 in the reference mark area 10 is formed of an opaque portion in which the stacked film of the halftone phase shift film 102 and opaque film 103 is formed on the transparent substrate 101. However, the surrounding portion 11 may be formed of a halftone portion in which the halftone phase shift film 102 is formed on the transparent substrate 101 with the opaque film 103 omitted.

Figure 12:
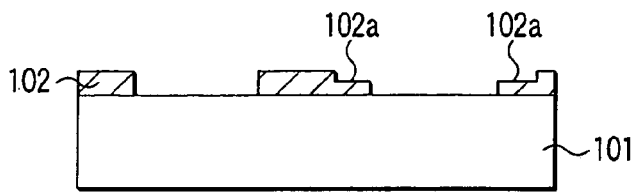
FIG. 12 is a sectional view showing a variation of the mask according to the fourth embodiment of the present invention.

In this case, when a pattern is written in the resist film 105 during the step shown in FIG. 11A, the resist 105 in the reference mark area 10 may also be irradiated with laser beams. Then, during a development step, the resist 105 may be removed from the reference mark area 10. In this case, the reference mark area 10 is not masked by the resist. As a result, during the step shown in FIG. 11B, the opaque film 103 in the reference mark area 10 is also etched to obtain a structure in which the halftone phase shift film 102 is exposed. Then, during the step shown in FIG. 11C, ion beams have only to be applied to that part of the phase shift mark area 20 in which the halftone phase shift film 102 is to be made thinner. This provides a structure such as the one shown in FIG. 12.

Also in this case, a calibration curve can be obtained which is similar to the one obtained if the opaque film is formed in the reference mark area 10. Accordingly, by determining the size difference between the patterns on the wafer after exposure and development, the magnitude of defocus can be obtained including its direction.

Embodiment 5

Now, a fifth embodiment of the present invention will be described.

The basic planar configuration of this embodiment is similar to the one shown in FIGS. 1 and 4 for the first embodiment. Accordingly, its detailed description is omitted.

With reference to FIGS. 14A to 14D, description will be given below of a manufacturing method for a mask according to the present embodiment. FIGS. 14A to 14D schematically show cross sections taken along line A-A' in FIG. 1. Components corresponding to the configuration shown FIGS. 2A to 2F for the first embodiment are denoted by the same reference numerals.

With the manufacturing method according to the present embodiment, for one of the reference mark area 10 and the phase shift mark area 20, the opening portions are etched using ion beams. For the other, the halftone phase shift film is etched around each opening portion using ion beams.

First, a structure such as the one shown in FIG. 14A is formed by executing steps similar to those shown in FIGS. 2A to 2D for the first embodiment. However, in the present embodiment, no resist patterns are formed in the reference mark area 10.

Then, as shown in FIG. 14B, a resist pattern (not shown) in a device pattern forming area (not shown) is used as a mask to wet-etch the opaque film 103. Subsequently, the resist pattern is removed using $O_2$ ashing and a mixed liquid of sulfuric acid and hydrogen peroxide. Then, the substrate is cleaned.

Then, as shown in FIG. 14C, the FIB processing apparatus is used to irradiate the areas corresponding to the opening portions in the phase shift mark area 10 with Ga ion beams 141 to etch the transparent substrate 101. The Ga ion irradiation conditions are, for example, an acceleration voltage (the energy of ion beams) of 20 kV and a current of 15 pA. If quartz has a refractive index of 1.508, an etching depth required to change the phase of exposure light of wavelength 248 nm by 90° is 122 nm. The amount of ion beams required to obtain this depth is $5.7 \times 10^{-2} C/cm^2$. To set an irradiation area, the inventors irradiated a 20-um square area including the mark portions with ion beams and observed secondary electron images to determine automatically the quartz substrate portion and the halftone portion. The amount of ion beams applied during observations is much smaller than that of ion beams required to etch the quartz substrate. The present step selectively forms holes 142 corresponding to the opening portions in the reference mark area 10.

Then, as shown in FIG. 14D, the FIB processing apparatus is used to irradiate selectively an area including a part of the surrounding portion of the phase shift mark area, with Ga ion beams 143. Thus, the halftone phase shift film 102 is etched. The Ga ion irradiation conditions are, for example, an acceleration voltage (the energy of ion beams) of 20 kV and a current of 15 pA. The etching depth is 50 nm, which is half the thickness of the halftone phase shift film 102, 100 nm. The amount of ion beams required to obtain this depth is $7.7 \times 10^{-3} C/cm^2$. To set an irradiated area, the inventors irradiated a 20-um square area including the mark portions with ion beams and observed secondary electron images to determine automatically the quartz substrate portion and the halftone portion. The amount of ion beams applied during observations is much smaller than that of ion beams required to etch the halftone phase shift film. The present step forms the thinner parts 102a of the halftone phase shift film 102, in the part of the surrounding portion of the phase shift mark area 20.

As described above, a mask configured as shown in FIGS. 1 and 14D is obtained. As a result, it is possible to give a phase difference of 90° (+90° or −90°; in the description below, −90° will be used) to the area in which the hole 142 is formed as compared with a reference surface S. Further, it is possible to give a phase difference of 90° (+90° or −90°; in the description below, +90° will be used) to the thinner part 102a of the halftone phase shift film 102 as compared with a reference surface S.

In the above example, after the holes 142 have been formed during the step shown in FIG. 14C, the thinner parts 102a of the halftone phase shift film 102 are formed during the step shown in FIG. 14D. However, the holes 142 may be formed after the formation of the thinner parts 102a of the halftone phase shift film 102.

In this manner, in the present embodiment, in those parts of the reference mark area 10 in which the holes 142 are formed, the phase shift is −90°. On the other hand, in the thinner parts 102a of the phase shift mark area 20, the phase shift is +90°. That is, the phase shift direction in the former parts is opposite to that in the latter parts. This serves to double sensitivity compared to the first to fourth embodiments.

FIG. 15 indicates the above matter. This figure shows the relationship (calibration curve) between a size difference (L-L') and defocus where L denotes the size of a long side of a reference mark on a wafer and L' denotes the size of a long side of a phase shift mark on the wafer. A line a indicates the size L of the reference mark. A line b indicates the size L' of the phase shift mark. A line c indicates the size difference (L-L'). A comparison with FIG. 22 indicates that the present embodiment almost doubles the sensitivity.

Consequently, also in the present embodiment, when the above mask is used to transfer patterns to a wafer (semiconductor substrate), there occurs a size difference between a focus monitor pattern on the wafer corresponding to the opening portions 12 in the reference mark area 10 and a focus monitor pattern on the wafer corresponding to the opening portions 22 in the phase shift mark area 20. Thus, as already described, by determining a calibration curve indicative of the relationship between the pattern size difference and the magnitude of defocus and subsequently determining the pattern size difference on the wafer after exposure and development, the magnitude of defocus can be obtained including its direction.

As described above, according to the present embodiment, the holes 142 are formed in the opening portions 12 in the reference mark area 10, whereas the thinner parts 102a of the half tone phase shift film is formed adjacent to the respective opening portion 22, in the surrounding portion 21 of the phase shift mark area 20. These holes 142 and thinner parts 102a are formed by irradiation with charged particles such as ion beams. This eliminates the needs for cumbersome photolithographic steps. Therefore, a precise mask can be formed using simple steps, thus avoiding an increase in manufacturing costs or TAT.

In the above embodiment, the step of forming the holes 142 as shown in FIG. 14C may be executed before the step shown in FIG. 14A (after the step shown in FIG. 2C) or after the step shown in FIG. 14A (before the step shown in FIG. 14B).

Further, many changes may be made to the ion beam irradiation area according to the present embodiment as described in the third and fourth embodiments.

In the above embodiment, when the thinner parts 102*a* of the halftone phase shift film are formed, only the halftone phase shift film 102 in the phase shift mark area 20 is selectively etched by irradiation with ion beams. However, the quartz substrate may be simultaneously irradiated with ion beams. However, since the quartz substrate is simultaneously etched, the halftone phase shift film must be etched by more than 50 nm before a phase difference of 90° can be obtained. The etching depth may be set in view of differences in etching speed and refractive index between the halftone phase shift film and the quartz substrate.

Further, in the third to fifth embodiments, if the FIB is used to etch the quartz substrate 101 or the halftone phase shift film 102, the quartz substrate 10 or the halftone phase shift film 102 may be irradiated with Ga ions in a vacuum. However, the quartz substrate 101 or the halftone phase shift film 102 may be etched by irradiation with Ga ions in a gas atmosphere containing, for example, F (fluorine), Cl (chlorine), Br (bromine), or I (iodine).

Further, in the third to fifth embodiments, electromagnetic waves such as laser beams may be used in place of ion beams. An etching operation may be performed, for example, on the basis of laser ablation using a processing apparatus having a laser light source of a triple harmonic (wavelength: 351 nm) of a YAG laser. In particular, if the halftone phase shift film is etched in the fourth and-fifth embodiments, the quartz substrate is not substantially etched because the quartz absorbs little laser light. Accordingly, even if the halftone phase shift film and the quartz substrate are simultaneously irradiated with laser beams, it is possible to etch only the halftone phase shift film selectively.

Further, actual mask manufacturing involves a step of correcting a mask defect found during a mask defect inspecting step. This correcting step uses an FIB apparatus or a laser processing apparatus. Thus, in the third to fifth embodiments, the mask manufacturing process can be made more efficient by continuously executing a etching step and a defect correcting step using ion beams or the like.

Furthermore, in the first to fifth embodiments, the absolute value of a phase difference between exposure light passing through the surrounding portion of the phase shift mark area and exposure light passing through the opening portions in the phase shift mark area is 90°. However, the phase difference is not limited to 90°.

Figure 16:
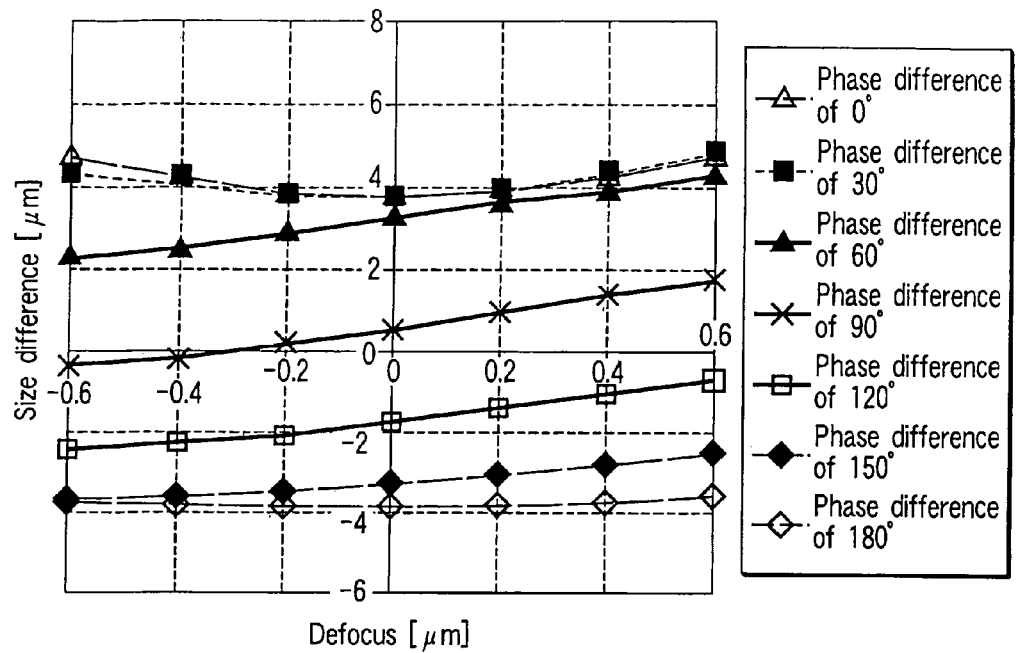
FIG. 16 is a graph showing the relationship between defocus and a size difference.

FIG. 16 shows the relationship between defocus and a size difference which relationship is observed when the phase difference is varied. This figure shows that lines indicative of phase differences of 60°, 90°, and 120° have an almost fixed inclination. Further, a line indicative of a phase difference of 150° has a smaller inclination than the above lines but indicates a tendency to increase monotonously.

Figure 17:
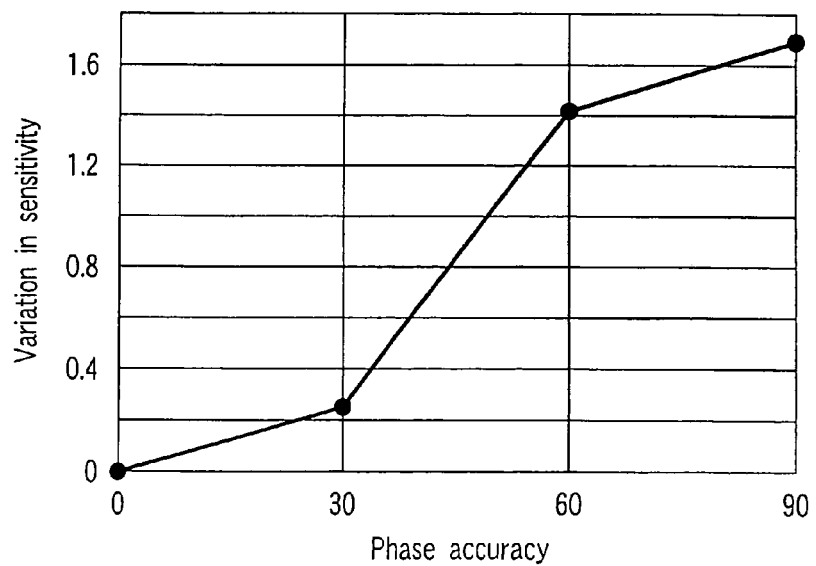
FIG. 17 is a graph showing the relationship between a phase accuracy and a variation in sensitivity.

FIG. 17 shows the relationship between phase accuracy and a variation in sensitivity which relationship is observed when the phase difference is set at 90°. Specifically, the axis of abscissa and the axis of ordinate indicate the magnitude of phase errors and the magnitude of a variation in sensitivity, respectively, observed if the phase difference is set at 90°. This figure indicates that the magnitude of a variation in sensitivity increases rapidly when the phase accuracy is 30° or more.

Thus, the phase difference is desirably at least 60° and at most 150°, more preferably at least 60° and at most 120°.

Further, in the first to fifth embodiments, the sizes of the focus monitor mark transferred to the wafer may be measured using an optical line width measuring instrument independent of the exposure apparatus, a line width measuring function contained in the exposure apparatus itself, or a measuring apparatus such as an SEM which is not optical.

Figure 18:
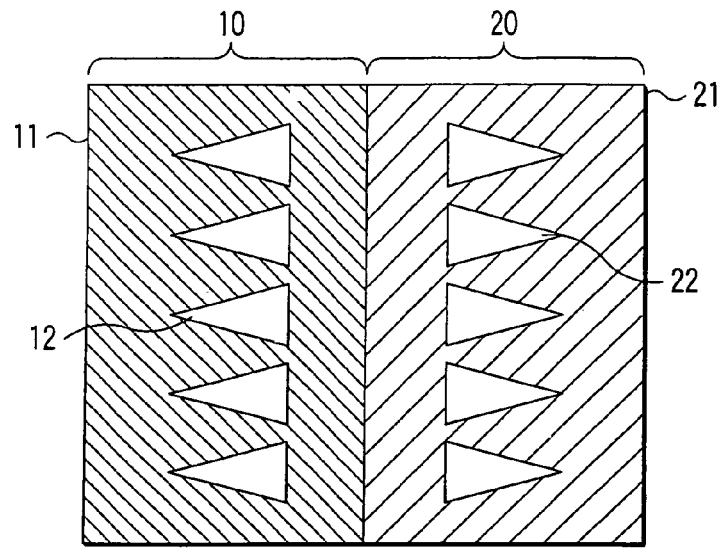
FIG. 18 is a diagram schematically showing a planar configuration of another example of a mark pattern formed area in a mask according to the embodiments of the present invention.

Furthermore, the focus monitor marks have only to be measurable using a line width measuring means. These marks may be shaped like, for example, wedges as shown FIG. 18. In short, the focus monitor marks have only to constitute a pattern having a width (a length in a short axis direction) decreasing from center to end or from one end to other end.

Moreover, the size and pitch of the focus monitor marks, the transmittance of the halftone phase shift film, and the like are also not limited to the above embodiments. They may be varied depending on exposure conditions used or the like.

Embodiment 6

Figure 19:
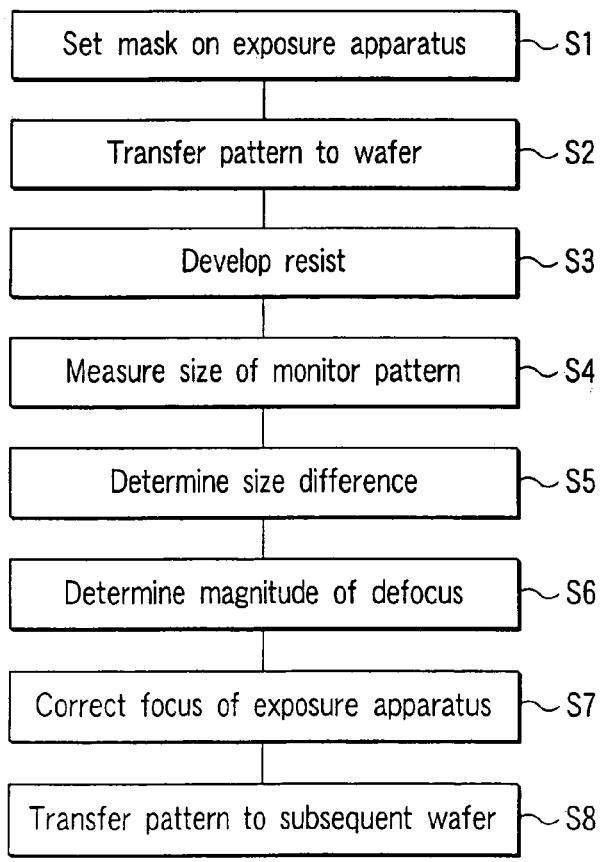
FIG. 19 is a flow chart showing steps executed if the mask according to the embodiments of the present invention is applied to manufacturing of a semiconductor device.
Figure 20:
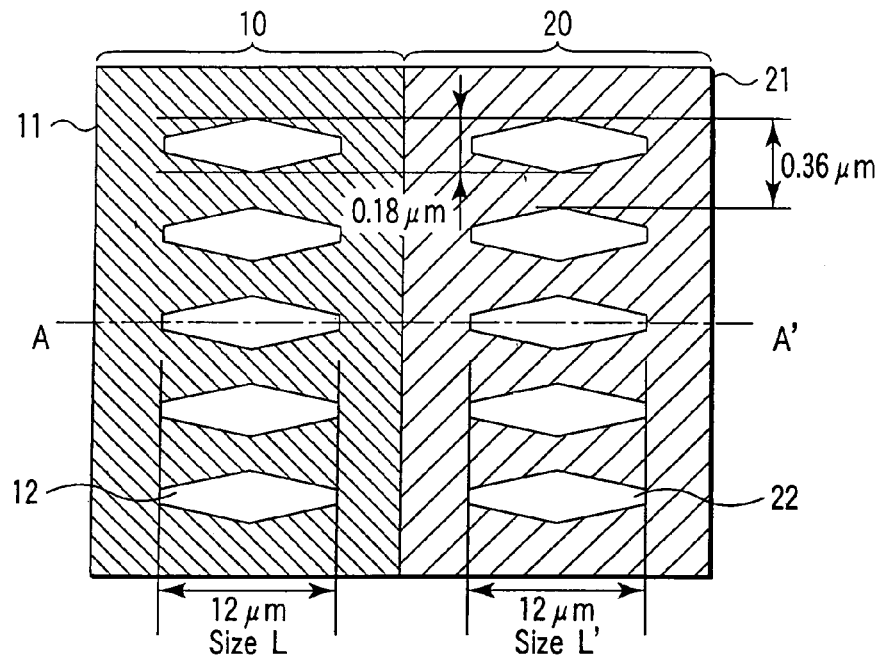
FIG. 20 is a diagram schematically showing a planar configuration of an example of a mark pattern formed area in a mask according to the prior art.

The present embodiment relates to a manufacturing method for a semiconductor device using a mask such as the one described in the first to fifth embodiments. The present embodiment will be described below with reference to the flow chart shown in FIG. 19.

A mask is set on the exposure apparatus (S1). Subsequently, the set mask is used to execute an exposure process to transfer a pattern to resist on a wafer (semiconductor substrate) (S2). Furthermore, the resist is developed (S3). Then, for a resist pattern resulting from the development process, measurements are made of the sizes of a focus monitor mark pattern corresponding to opening portions in a reference mark area and of a focus monitor mark pattern corresponding to opening portions in a phase shift mark area (S4). Subsequently, the size difference between these patterns is determined (S5). Subsequently, the magnitude of defocus corresponding to the size difference obtained is determined on the basis of a previously determined calibration curve (S6).

The above process is executed on a predetermined number of wafers in a certain lot. The average value of the magnitude of defocus is determined to be the magnitude of defocus for that lot. Then, the focus position of the exposure apparatus is corrected on the basis of the average magnitude of defocus (S7). Subsequently, the pattern is transferred to wafers in the subsequent lot using the exposure apparatus with its focus position corrected as well as the above wafer (S8).

By executing the above process on each lot, the lot can always be processed using the optimum focus position. This enables the improvement of the yield and characteristics of semiconductor devices.

The focus position of a device pattern may differ from the focus position of focus monitor marks owing to aberration in the exposure apparatus, the shape of a base for the device pattern, or the like. In such a case, it is possible to feed back the magnitude of defocus determined taking such offset values characteristic of the device into account.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising transferring a pattern provided on a mask to a substrate using an exposure apparatus, the mask comprising:
a first area including a first surrounding area in which a halftone phase shift film or a stacked film of a halftone phase shift film and an opaque film is provided on a transparent substrate, and a first opening area surrounded by the first surrounding area; and
a second area including a second surrounding area in which a halftone phase shift film is provided on the transparent substrate and a second opening area surrounded by the second surrounding area,
wherein a transparent film is provided in at least a part of the second opening area, the transparent film being configured to give a predetermined phase difference to exposure light passing through that part of the second opening area in which the transparent film is provided relative to exposure light passing through the second surrounding area.

2. The method according to claim 1, further comprising:
determining sizes of a first mark pattern corresponding to the first opening area and of a second mark pattern corresponding to the second opening area, the first mark pattern and the second mark pattern being included in the transferred pattern;
determining a magnitude of defocus on the basis of the sizes;
adjusting a focus of the exposure apparatus on the basis of the magnitude of defocus; and
transferring the pattern provided on the mask to a semiconductor substrate using the exposure apparatus with the adjusted focus.

3. The method according to claim 1, wherein the transparent film comprises an SOG film.

4. The method according to claim 1, wherein an absolute value of the predetermined phase difference is at least 60° and at most 150°.

5. The method according to claim 1, wherein a phase difference between exposure light passing through the halftone phase shift film in the first surrounding area and exposure light passing through the first opening area is 180°.

6. The method according to claim 1, wherein the first opening area has substantially the same planar shape as that of the second opening area.

7. The method according to claim 6, wherein the planar shape is a rhomboid or a wedge.

8. The method according to claim 1, wherein the first and second areas are provided outside a device pattern forming area.

9. A method of manufacturing a semiconductor device comprising transferring a pattern provided on a mask to a substrate using an exposure apparatus, the mask comprising:
a first area including a first surrounding area in which a halftone phase shift film or a stacked film of a halftone phase shift film and an opaque film is provided on a transparent substrate, and a first opening area surrounded by the first surrounding area; and
a second area including a second surrounding area in which a halftone phase shift film is provided on the transparent substrate and a second opening area surrounded by the second surrounding area,
wherein at least a part of the halftone phase shift film in the second surrounding area is thinner than the halftone phase shift film in the first surrounding area, and is configured to give a predetermined phase difference to exposure light passing through that part of the second surrounding area which includes the thinner part of the halftone phase shift film relative to exposure light passing through the second opening area.

10. The method according to claim 9, further comprising:
determining sizes of a first mark pattern corresponding to the first opening area and of a second mark pattern corresponding to the second opening area, the first mark pattern and the second mark pattern being included in the transferred pattern;
determining a magnitude of defocus on the basis of the sizes;
adjusting a focus of the exposure apparatus on the basis of the magnitude of defocus; and
transferring the pattern provided on the mask to a semiconductor substrate using the exposure apparatus with the adjusted focus.

11. The method according to claim 9, wherein an absolute value of the predetermined phase difference is at least 60° and at most 150°.

12. The method according to claim 9, wherein a phase difference between exposure light passing through the halftone phase shift film in the first surrounding area and exposure light passing through the first opening area is 180°.

13. The method according to claim 9, wherein the first opening area has substantially the same planar shape as that of the second opening area.

14. The method according to claim 13, wherein the planar shape is a rhomboid or a wedge.

15. The method according to claim 9, wherein the first and second areas are provided outside a device pattern forming area.

* * * * *